United States Patent [19]

Werba et al.

[11] Patent Number: 4,716,397
[45] Date of Patent: Dec. 29, 1987

[54] METHOD AND APPARATUS FOR VERY HIGH SPEED ANALOG-TO-DIGITAL CONVERSION

[76] Inventors: Hans Werba, Theresienstrasse 11, D-8390 Passau, Fed. Rep. of Germany; Rudolf Schlögel jun., Im Tal 9, A-6060 Absam (Tirol), Austria

[21] Appl. No.: 714,387

[22] Filed: Mar. 21, 1985

[30] Foreign Application Priority Data

Mar. 23, 1984 [DE] Fed. Rep. of Germany ....... 3410796
Jul. 10, 1984 [DE] Fed. Rep. of Germany ....... 3425399

[51] Int. Cl.[4] .............................................. H03M 1/36
[52] U.S. Cl. ........................... 340/347 AD; 332/31 R; 340/347 M
[58] Field of Search ................. 340/347 AD, 347 CC, 340/347 M; 307/289; 332/31 R

[56] References Cited

U.S. PATENT DOCUMENTS

4,211,999  7/1980  Clark et al. .................. 340/347 AD

Primary Examiner—T. J. Sloyan
Attorney, Agent, or Firm—Bacon & Thomas

[57] ABSTRACT

An analog/digital converter having a number of threshold circuits depending on the necessary bit resolution, the inputs of these threshold circuits being fed the analog signal to be digitized and the digitized signal being available at their outputs. The inputs of the threshold circuits are preceded by a modulator circuit in which the analog signal to be digitized is modulated by amplitude modulation upon a carrier frequency stable in frequency.

8 Claims, 13 Drawing Figures

METHOD AND APPARATUS FOR VERY HIGH SPEED ANALOG-TO-DIGITAL CONVERSION

The present invention relates to an analog/digital converter and a method for analog/digital conversion.

Conventional analog/digital converters (referred to as A/D converters in the following) usually have, as threshold circuits, comparator circuits containing transistors which work in the cut-off region or in the saturation region depending on whether the threshold is exceeded or not. Due to the time delay effects involved in transistors working at times in the saturation region, such A/D converters set limits on the maximum frequency of the analog signal to be digitized, which are often not acceptable.

A/D converters must usually work in a fairly wide frequency band in which the analog signal to be digitized may be located. Due to the complex input impedance there is a frequency-dependent switching threshold in the threshold circuits used in conventional A/D converters, so that the accuracy of digitization decreases in particular in the upper processable frequency range. Furthermore, the analog signal to be converted must have a minimum of power for reliable and correct digitization.

The invention is based on the problem of remedying such impairments and in particular of achieving independence of the power of the analog signal to be converted and of being able to convert analog signals with higher frequencies than is possible using conventional A/D converters.

Solutions to this problem in terms of method and apparatus are stated in the claims and may be advantageously developed in accordance with the subclaims.

A solution in terms of apparatus consists in an A/D converter having a number of threshold circuits which depends on the necessary quantization resolution, the inputs of these circuits being fed the analog signal to be digitized and the digitized signal being available at their outputs, the inputs of the threshold circuits being preceded by a modulator circuit in which the analog signal to be digitized is modulated by amplitude modulation upon a constant carrier frequency.

The fact that the threshold circuits of this inventive A/D converter are not acted upon directly by the analog signal to be converted, but by the carrier frequency amplitude-modulated with the analog signal, ensures that the threshold circuits are operated at a fixed frequency. It is thus ruled out that the conversion accuracy be affected by any frequency-dependent behavior of the threshold circuits. The power offered to the threshold circuits is no longer determined by the analog signal but by the carrier frequency, the power of which can be set without any problem.

In a particularly preferred manner the threshold circuits are constructed according to the invention with diode circuits, a particularly preferred embodiment being designed in accordance with claim 6. When diode networks are used in the threshold circuits, particularly high frequencies can be processed; using certain diode types such as Schottky diodes, p-i-n-type diodes, etc., one can even go into the gigahertz range.

In a development of the invention according to claim 8 the conversion of the analog signal into an amplitude-modulated high-frequency signal is particularly advantageous. In this embodiment a capacitor is used in the known manner between the output of each threshold circuit and the input of the following memory in order to separate the d.c. voltage components at the outputs of the individual threshold circuits, which vary in size. If the inventive measure for converting the amplitude-modulated high-frequency signal were not used, but instead the threshold circuits acted upon directly by the analog signal to be converted, the exceeding of the particular threshold would not be indicated at the input of the individual memories during the entire time it is exceeded, but only at the moments when the analog signal passes the threshold in the one or other direction, the indication taking place in the form of differentiating pulses occuring at the accents of the passing of the threshold. The use of the high-frequency signal amplitude-modulated with the analog signal allows for the exceeding of the particular threshold to remain indicated during the whole time it is exceeded, on the output side of the particular capacitor, i.e. at the input of the particular memory.

In the case of a solution in terms of method, a carrier frequency signal is amplitude-modulated with the analog signal to be digitized and the modulated carrier frequency signal is weighted with respect to its amplitude. For this, a reference signal is rated with the frequency of the carrier frequency signal in a number of amplitude levels which depends on the necessary fineness of quantization, the amplitude of the modulated carrier frequency signal is compared with that of each individual amplitude level of the reference signal, and when the amplitude is the same for the modulated carrier frequency signal and an amplitude level of the reference signal a first binary logical value (e.g. "0") is assigned, and otherwise the second binary logical value (e.g. "1") is assigned.

The essential principle of this solution is that a carrier frequency signal amplitude-modulated with the analog signal to be digitized is compared with a reference carrier frequency signal with the same frequency and the same or opposite phase position, graded in terms of amplitude in a number of levels corresponding to the necessary bit resolution, comparison taking place simultaneously on all levels. At the level at which the amplitude-modulated carrier frequency signal and the reference carrier frequency signal have the same amplitude, there is genuine cancellation when opposite phase positions are used, and quasi-cancellation when the same phase position is used, which each prove to be a fairly sharp criterion for the instantaneous position of the amplitude value of the analog signal to be digitized.

Particularly high resolution sensitivity can be achieved for the analog/digital conversion when, as a development of this inventive idea, the reference carrier frequency signal is also amplitude-modulated with the analog signal to be digitized, but with a phase position of the analog signal opposite to that with which the amplitude modulation of the other modulated carrier frequency signal is carried out. This measure doubles the digtization sharpness which may be obtained.

The two amplitude-modulated carrier frequency signals can also be compared with each other in the same or opposite phase positions when an amplitude-modulated carrier frequency signal is used as a reference carrier frequency. When the two carrier frequency signals to be compared have opposite phase positions, one should advantageously use amplifiers which act as zero detectors for the amplitude comparator circuits, these amplifiers showing mutual cancellation of the two carrier frequency signals to be compared by displaying a zero value which the logical value "0" may be assigned to, for example. In the embodiment with the same phase position of the two carrier frequency signals to be compared, one should advantageously use differential amplifiers for the individual amplifier comparator circuits, which can also provide a zero value signal at the output when the amplitudes of the two carrier frequency signals to be compared thereby are the same, so that they act as a cancellation indicator (quasi-cancellation).

The number of amplitude comparator circuits used for the A/D converter depends on the necessary fineness of quantization or bit resolution. It may happen, in particular when a relatively small number of parallel-working amplitude comparator circuits are used, that identical amplitudes of the two carrier frequency signals to be compared, or their mutual cancellation, do not occur exactly at one of the comparator stages but between two comparator stages. There is then no exact cancellation or quasi-cancellation at the next comparator stage, but rather an output signal other than zero, the level of which depends on the digitization resolution, i.e. the number of comparator stages used. In order to guarantee clear digitization of the analog signal in these cases as well, it is particularly advisable to use circuitry with threshold behavior for the amplitude comparator circuits, or to have these amplitude comparator circuits followed by threshold circuits whose thresholds may be used to fix the differentiating limit between the two binary logical values "0" and "1".

The term "relative amplitude level" used in the claims is intended to express that the individual amplitude levels do not have fixed absolute amplitude values, but relative amplitude values depending in each case on the instantous voltage value of the amplitude-modulated carrier frequency signal, their relative quantities remaining equal to this instantaneous voltage value.

When carrier frequency signals are mentioned in this solution of the invention, this is intended to include frequencies down to zero. For d.c. voltage whose amplitude is modulated by the analog signal to be digitized can also be used as a carrier. In cases in which only one carrier is modulated, the weighting circuits receive the modulated d.c. voltage on one side and the constant, non-modulated d.c. voltage on the other side. In cases in which both carriers are modulated, the individual amplitude comparator circuits receive at both of their inputs the two d.c. voltage signals modulated in phase opposition.

As already mentioned, particularly high resolution sensitivity of the A/D conversion can be obtained in this solution when the reference carrier frequency signal is also amplitude-modulated with the analog signal to be digitized. It is necessary to use two chains of resistors for this purpose in the solution described.

In a particularly advantageous development of this idea of a solution this high resolution sensitivity can also be obtained, however, using a single chain of resistors. This is done by modulating in terms of amplitude the analog signal to be digitized in a first phase position upon a first carrier frequency signal, and in a second phase position opposite the first phase position upon a second carrier frequency signal whose frequency is identical to that of the first carrier frequency signal but whose phase position is opposite that of the first carrier frequency signal, feeding the amplitude-modulated first carrier frequency signal into one end of the chain of resistors and the amplitude-modulated second carrier frequency signal into the other end of this chain of resistors, detecting that voltage divider point of the chain of resistors at which the carrier frequency signals fed into both ends of the chain of resistors are cancelled, and assigning this voltage divider point a first binary value (e.g. "0") and all other voltage divider points the other binary value (e.g. "1"), the resulting binary value pattern constituting the converted analog signal value.

It applies again here that the carrier frequency can go down to zero. In this case the analog signal to be digitized is modulated upon a first d.c. voltage signal of a first polarity and a second d.c. voltage signal with the same value but the opposite polarity, the amplitude-modulated first d.c. voltage signal being fed into one end of the chain of resistors and the amplitude-modulated second d.c. voltage signal being fed into the other end of the chain of resistors and that voltage divider point of the chain of resistors being detected at which the d.c. voltage signals fed into both ends of the chain of resistors are cancelled.

A preferred A/D converter working according to this method includes two amplitude modulators which are each fed the carrier frequency signal or the d.c. voltage and the modulated analog signal with the stated phase relations. Zero detectors are connected to the voltage divider points of the chain of resistors, these zero detectors being used to detect that voltage divider point at which voltage level zero results due to the cancellation of the modulated signals fed into both ends. The zero detector connected to this voltage divider point is then assigned the binary value "0", for example. All other zero detectors are assigned the binary value "1". This binary value pattern, i.e. the position of the binary value "0" within the other binary values "1", results in the digital code of the digitized analog signal. This binary value pattern can be converted into a dual code, for example, using a priority decoder known per se.

An essential point of this inventive solution is that the antiphase amplitude modulation of the antiphase carrier frequency signals of equal frequency, or of two d.c. voltages of equal value but opposite polarity, makes it possible for the cancellation of the modulated signals fed into each end of the chain of resistors to occur always at some point in the chain of resistors.

A particularly preferred development of this inventive solution, by which very high quantization resolution can be obtained using a relatively small number of resistors, includes a second chain of resistors. The first chain of resistors functions as a coarse divider chain of resistors or coarse chain or resistors, and the second chain of resistors acts as a fine divider chain of resistors or a fine chain of resistors. The binary value pattern picked up from the coarse divider chain and the binary value pattern picked up from the fine divider chain together form the digitized analog signal value. In a particularly preferred embodiment, each of the two chains of resistors is followed by a priority decoder, one of which provides the more significant bits of the dual-coded analog signal value and the other of which provides the less significant bits thereof.

One proceeds in this development by first detecting that resistor of the coarse divider chain at the two ends of which voltage levels of opposite polarity occur. The voltage level occurring at one end point of this resistor is then fed into one end of the fine divider chain directly and into the other end thereof after d.c. voltage is superimposed. This superimposed d.c. voltage is equal to the voltage drop across that resistor of the coarse divider chain at the two ends of which voltage levels of opposite polarity have been detected. To make matters simpler, all resistors of the coarse divider chain will be made equally large in a particularly preferred manner, so that the superimposed d.c. voltage can be kept constant.

The d.c. voltages fed into each end of the fine divider chain may be amplified before they are fed in, in order to obtain higher voltage differences at the various voltage divider points of the fine divider chain and thus higher sharpness of digitization.

In connection with the present invention, resistors of which the chains of resistors are composed, are to be understood in the sence of ohmic resistors, inductivities and capacitors of combinations thereof.

In connection with the present invention, the terms "same" or "equal amplitudes", "cancellation of the voltage values" are not to be understood in the strict sense of a complete equality of amplitudes or a complete cancellation. These terms also include such cases in which equal amplitudes or a cancellation is achieved only approximately or only substantially because the analog signal value to be converted is located between two quantization steps.

The invention shall now be explained in more detail, including further aspects of the invention, the problem and the advantages involved, with reference to embodiments.

Figure 1:
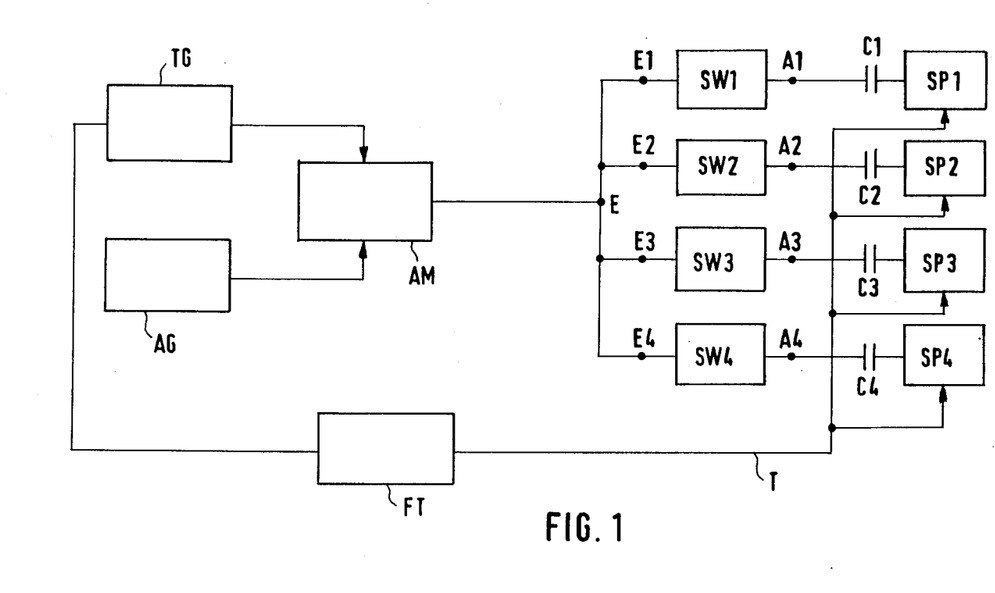
FIG. 1 block diagram of a first embodiment of an inventive A/D converter

In the embodiment of an inventive A/D converter shown in the form of a block diagram in FIG. 1, an amplitude modulator AM is fed a carrier frequency from a carrier frequency generator TG, on the one hand, and the analog signal to be converted from an analog signal source AG, on the other hand. The amplitude-modulated signal occurring at the output of the amplitude modulator AM is given via an input connection E to inputs E1 to E4 of several threshold circuits SW1 to SW4. A capacitor C1 to C4 is connected to each of their outputs A1 to A4, memories SP1 to SP4 being in turn connected to these capacitors.

In the embodiment shown, four threshold circuits are used. Depending on the desired quantization resolution of the A/D converter, a different number of threshold circuits, in particular a larger number, may also be used. The signals fed to the inputs of memories SP1 to SP4 are read in in fixed cycles controlled by a common clock signal T. An independent clock oscillator may be used for this purpose. The clock rate is preferably derived from the carrier frequency, for which purpose the carrier frequency may be reduced to the desired clock rate by means of a frequency divider FT, if necessary.

Figure 2:
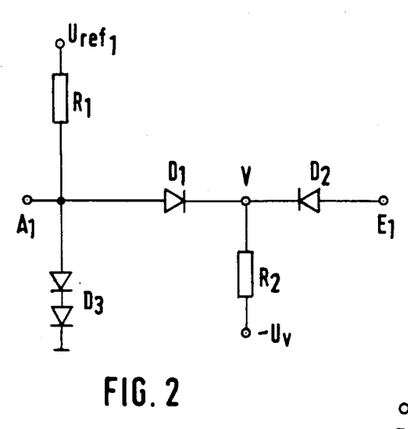
FIG. 2 a particularly preferred embodiment of a threshold circuit suitable for such an A/D converter FIG. 3 a second embodiment of an inventive A/D converter FIG. 4 a third embodiment of an inventive A/D converter FIG. 5 a first embodiment of an amplitude comparator circuit which may be used for the A/D converters according to FIGS. 3 and 4

FIG. 2 shows a preferred diode circuit for a threshold circuit, for example SW1 in FIG. 1. Between input E1 and output A1 there are two diodes D1 and D2 connected back to back, whose common connecting point V is connected via a resistor R2 to a potential $-U_v$, which is preferably ground potential. Output connection A1 is simultaneously the connecting point between a resistor R1 and a series circuit D3 comprising two diodes. The end of resistor R1 not connected to output A1 is connected to a reference voltage source $U_{ref1}$, while the end of the diode circuit D3 not connected to A1 is connected to a reference potential, which is preferably also ground.

The two resistors R1 and R2 constitute simple forms of current sources in this circuit, but they may be replaced by other forms of current source circuits, for example transistors, field-effect current sources, current mirror circuits and so on. The diode circuit D3 has a voltage limiting function. The number of diodes connected in series for D3 depends on the limiting threshold necessary in the particular case. It is also possible to use Zener diodes here.

The threshold circuit shown in FIG. 2 operates in the following manner.

Let it first be assumed that the signal to be converted which occurs at input E1 has the voltage level zero. A current then flows from $U_{ref1}$ via resistor R1, diode D1 and resistor R2. The value of this current depends on $U_{ref1}$ and on the two resistors R1 and R2. The current causes a certain voltage potential at circuit point V, this voltage potential determining the threshold to be compared with the analog signal. The voltage potential at circuit point V is selected so as to be lower by the bottoming voltage of diode D2 than the threshold with which the analog signal is to be compared.

As soon as the signal to be converted which occurs at E1 exceeds the threshold of this threshold circuit, diode D2 becomes conductive, thereby reducing the current flowing through D1 and thus increasing the voltage at output A1 in the direction of the voltage level of $U_{ref1}$. In order that the voltage does not become too high at A1, it is limited by aid of D3. The voltage level which comes about at A1 when the signal to be converted is below the threshold at E1, is defined as one of the two binary logical values, for example "0", while the voltage level which comes about at A1 when diode D2 is conductive is defined as the other logical value, i.e. "1" in this example.

For the various threshold circuits SW1 to SW4, whose thresholds vary, either different reference voltages $U_{ref1}$, $U_{ref2}$, ... and the same values for resistors R1, R2, or the same reference voltages and different values for at least one of these two resistors R1 and R2 are selected. A further possibility of adjusting the threshold is given by selecting different types of diodes with different bottoming voltages. Different bottoming voltages may also be obtained by a different number of series-connected diodes instead of individual diodes D1 and/or D2.

Figure 3:
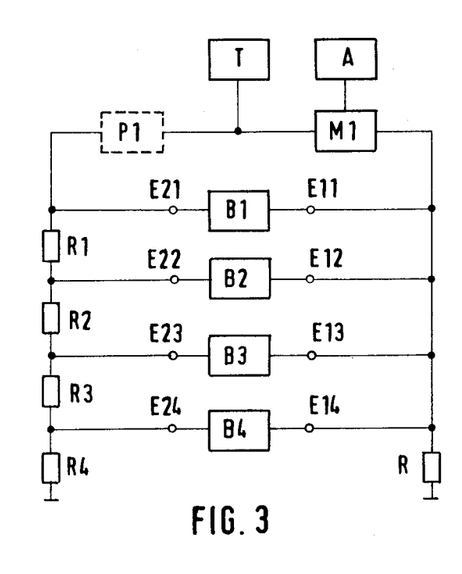

FIG. 3 shows a second embodiment of an inventive A/D converter in which a carrier frequency signal amplitude-modulated with the analog signal to be converted is compared with amplitude values of the non-modulated carrier frequency signal which are graded at different degrees.

A modulator M1 is fed the carrier frequency signal coming from a carrier frequency source T, on the one hand, and the analog signal to be digitized coming from an analog signal source A, on the other hand. At the output of modulator M1 an amplitude-modulated carrier frequency signal then appears. The output of modulator M1 is connected via a resistor R to ground, on the one hand, and to four first inputs E11, E12, E13, E14 of four amplitude comparator circuits B1, B2, B3, B4, respectively, on the other hand. The carrier frequency source T is also connected via a phase shifter P1 which shifts the phase position of the carrier frequency signal by 180°, to the input of a voltage divider chain of resistors having four resistors R1, R2, R3 and R4, which is connected at its other end to ground. The ends of resistors R1, R2, R3, R4 located closer to the carrier frequency source T are connected to second input connections E21, E22, E23, E24, respectively, of amplitude comparator circuits B1, B2, B3, B4, respectively.

Phase shifter P1 is shown as a broken-line block since it is only provided optionally in case the non-modulated carrier frequency signal used as a reference signal is fed to amplitude comparator circuits B1 to B4 with a phase position opposite that of the modulated carrier frequency signal.

Resistors R1 to R4 preferably have the same resistance values, so that divided voltages which may be picked up from adjacent taps of this chain of resistors have the same voltage intervals.

While the non-modulated carrier frequency signal has constant amplitude values, the amplitude values of the amplitude-modulated carrier frequency signal vary in accordance with the modulating analog signal. Assuming, for example, a modulation depth of 50% and a sinusoidal analog signal, the positive amplitude of the modulated carrier frequency signal, for example, varies periodically between 50% and 150% of the value of the positive amplitude of the non-modulated carrier frequency signal. If the circuit shown in FIG. 3 is now designed in such a way that the voltage level occurring at the first inputs E11 to E14 at the maximum amplitude value of the modulated carrier frequency signal is equal to the amplitude value of the non-modulated carrier frequency signal occurring at the second input E21, a voltage balance is detected between the two inputs E11 and E21 of the uppermost amplitude comparator circuit when such a maximum amplitude of the modulated carrier frequency signal is present; otherwise the voltage balance is between the inputs of one of the amplitude comparator circuits B2 to B4 therebelow. If the output signal of that amplitude comparator circuit which detects equal voltages at its two inputs is assigned the binary logical value "0" and the output signals of all other amplitude comparator circuits are assigned the binary logical value "1", a binary code is obtained in which the position of the single logical value "0" characterizes the digitized instantaneous value of the analog signal.

Figure 4:
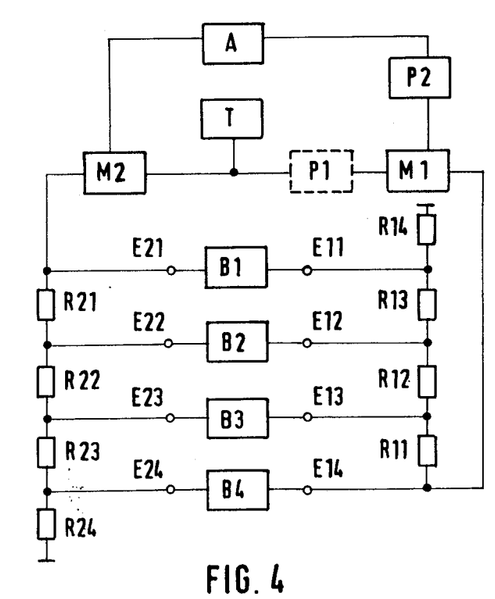

FIGS. 3 and 4 show embodiments with only four amplitude comparator circuits. In reality a much larger number of amplitude comparator circuits will of course be used, in order to obtain much finer digitization resolution than can be obtained with only four amplitude comparator stages. The number of resistors in the voltage divider chains of resistors is then increased by the corresponding number so that just as many divided voltages can be made available, which then of course have smaller voltage intervals than in the case of only four amplitude comparator stages.

In the following consideration of the mode of operation of the embodiment shown in FIG. 3, the variant to be considered first is that in which the modulated and the non-modulated carrier frequency signals are used with the same phase position, so that phase shifter P1 is not present but the carrier frequency source T is directly connected to the input of the chain of resistors R1 to R4. Depending on the instantaneous value of the amplitude-modulated analog signal, an amplitude balance then occurs at the two inputs of some one of the amplitude comparator circuits between the modulated carrier frequency signal fed to the first input of this amplitude comparator circuit and the level of divided voltage of the non-modulated carrier frequency signal fed to the second input of this amplitude comparator circuit. This balance between the amplitude values at the two inputs of this amplitude comparator circuit is assigned the logical value "0". There is an imbalance, which is assigned the logical value "1", between the amplitude values which are fed to the two inputs of the other amplitude comparator circuits. The reverse assignment of these logical values is of course also possible.

However, if the amplitude-modulated carrier frequency signal and the non-modulated carrier frequency signal are fed to the individual amplitude comparator circuits with opposite phases, i.e. if phase shifter P1 shown by broken lines in FIG. 1 is added between the carrier frequency source T and the input of the chain of resistors R1 to R4, cancellation takes place at some one of the amplitude comparator circuits B1 to B4 between the amplitudes of the modulated carrier frequency signal and the non-modulated carrier frequency signal occurring at its two inputs, in the case of a certain instantaneous value of the modulating analog signal. In this case the cancellation can be assigned the logical value "0" and the non-cancellation can be assigned the logical value "1", or vice versa.

Figure 5:
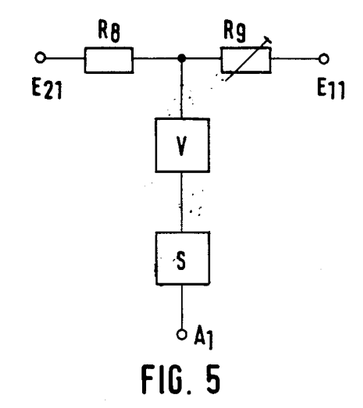
Figure 6:
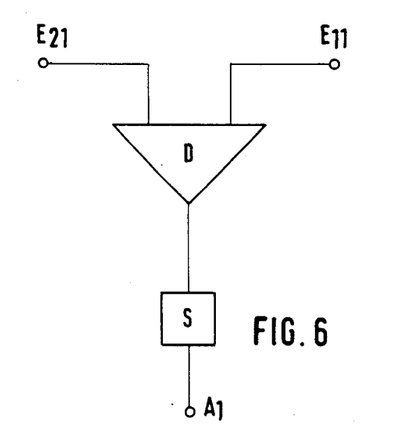
FIG. 6 a second embodiment of an amplitude comparator circuit which may be used for the A/D converters according to FIGS. 3 and 4

FIGS. 5 and 6 show preferred embodiments of amplitude comparator circuits B1 to B4, the embodiment in FIG. 3 being suitable for operation with opposite phase positions of the modulated and non-modulated carrier frequency signals, and the embodiment according to FIG. 4 being suitable for operation with the same phase position of the modulated and non-modulated carrier frequency signals. In FIGS. 5 and 6 the uppermost amplitude comparator circuit B1 is considered in each case as an example.

The embodiment shown in FIG. 5 for operation with opposite phase positions has a series circuit comprising two resistors R8 and R9 between the first input E11 and the second input E21. R9 may be designed as a variable resistor for purposes of balancing. An amplifier V is connected to the connecting point between R8 and R9 and is followed by a threshold circuit S. Its output forms the output A1 of the amplitude comparator circuit. If cancellation occurs at the amplitude comparator circuit under consideration between the amplitudes fed to its two inputs, an output signal zero occurs at the output of amplifier V. If there is no cancellation at the amplitude comparator circuit under consideration, an output signal other than zero occurs at the output of amplifier V. Since, an exact signal value of zero does not occur at any amplifier output when the instantaneous value of the analog signal is between two adjacent quantization steps, the threshold circuit S is provided, by means of which non-zero voltage levels below a predetemined threshold are still assigned the logical value "0".

The threshold circuit need not be a separate circuit if an amplifier with threshold behavior is used for V.

The amplitude comparator circuit shown in FIG. 6 for operation with the same phase position of the modulated and non-modulated carrier frequency signals comprises a differential amplifier D whose two inputs form the first input E11 and the second input E21 of the amplitude comparator circuit, respectively. A threshold circuit S is again connected to the output of the differential amplifier D, the output of this circuit also forming the output A1 of the amplitude comparator circuit. The use of a differential amplifier D leads to good d.c. suppression of any d.c. voltage components which might be present.

If the thresholds of threshold circuits S in FIGS. 5 and 6 are raised accordingly, the effect which can be achieved is that in the case of cancellation in operation with opposite phase positions or in the case of amplitude balance in operation with the same phase position, which acts like quasi-cancellation at the output of the differential amplifier D, the logical value assigned to this state, for example "0", occurs not only at the output of one amplitude comparator circuit, but at the outputs of two or more adjacent amplitude comparator circuits. One can then conclude the digitized instantaneous value of the analog signal from the positions of the various logical values "0" within the binary value pattern.

The third embodiment of the inventive A/D converter shown in FIG. 4 differs from the embodiment shown in FIG. 3 in that the reference signal is also amplitude-modulated with the analog signal to be digitized. For this purpose the embodiment shown in FIG. 4 has not only the components of the embodiment according to FIG. 3 but also a second modulator M2, a second phase shifter P2 and a second voltage divider chain of resistors R11, R12, R13, R14. Resistors R21, R22, R23, R24 of the voltage divider chain of resistors on the left in FIG. 4 are identical to resistors R1, R2, R3 and R4, respectively, of the voltage divider chain of resistors in FIG. 3.

The analog signal from the analog signal source is fed to one modulator, for example the first modulator M1, as shown in FIG. 4, via the second phase shifter P2 which shifts the phase position of the analog signal by 180°. The second modulator M2 is fed the analog signal directly. As in the first embodiment of FIG. 3, the two amplitude-modulated carrier frequency signals may be used in the same or opposite phase positions, for which purpose phase shifter P1 shown by broken lines is omitted or added accordingly. It makes no difference if phase shifter P1 precedes the first modulator M1 or the second modulator M2, just as it makes no difference if the second phase shifter P2 precedes the first modulator M1 or the second modulator M2.

As shown in FIG. 4, the first inputs E11 to E14 of amplitude comparator circuits B1 to B4 are connected to the chain of resistors R11 to R14 in an order which is opposite that in which the second inputs E21 to E24 of amplitude comparator circuits B1 to B4 are connected to the chain of resistors R21 to R24. This means that the first input E11 of the uppermost amplitude comparator circuit B1 is connected to the lowest level of divided voltage of the amplitude-modulated carrier frequency signal coming from the first modulator M1, while the second input E21 of this amplitude comparator circuit B1 is connected to the highest level of divided voltage of the modulated carrier frequency signal coming from the second modulator M2. The first input E12 of the second amplitude comparator circuit B2 is connected to the second lowest level of divided voltage of the chain of resistors R11 to R14, while the second input E22 of this amplitude comparator circuit is connected to the second highest level of divided voltage of the chain of resistors R21 to R24; and so on.

As in the case of FIG. 3, an amplitude balance is obtained at the two inputs of one of the amplitude comparator circuits when the two modulated carrier frequency signals are fed in-phase, while cancellation at one of the amplitude comparator circuits is obtained when the two amplitude-modulated carrier frequency signals have opposite phase positions. Due to the use of two amplitude-modulated carrier frequency signals which are amplitude-modulated with opposite phase positions, one obtains in this embodiment digitization sensitivity which is twice as high as in the embodiment according to FIG. 3. This means that the stage at which an amplitude balance or cancellation occurs is much more sharply defined in the embodiment according to FIG. 4 than in the embodiment according to FIG. 3. Using a correspondingly high number of amplitude comparator circuits, one can therefore obtain a degree of digitization resolution which is twice as high as in the embodiment according to FIG. 3.

Unlike conventional A/D converters, the inventive A/D converter does not require any comparators having transistors which work in the saturation region and therefore involve time delays. The inventive A/D converter instead makes use of amplifiers or differential amplifiers which are virtually free of time delays. It is therefore suitable for frequencies up to the gigahertz range. The exploitation of cancellation or quasi-cancelation allows for sharp digital weighting, in turn allowing for high digitization resolution. Since a fixed carrier frequency is involved, there is nothing to influence or falsify the frequency response. Furthermore, the circuit components can be operated with virtually constant power since a constant carrier frequency and a predetermined depth of modulation are used, so that no falsifications due to power-dependent behavior of individual circuit components can occur either. The inventive A/D converter is therefore not only suitable for high frequencies but also has very high digitization accuracy.

As has already been mentioned, the carrier frequency may be reduced to zero, i.e. d.c. voltage modulated with the analog signal. Cancellation or quasi-cancellation also occurs in this case in the range of one of the weighting or amplitude comparator stages.

Figure 7:
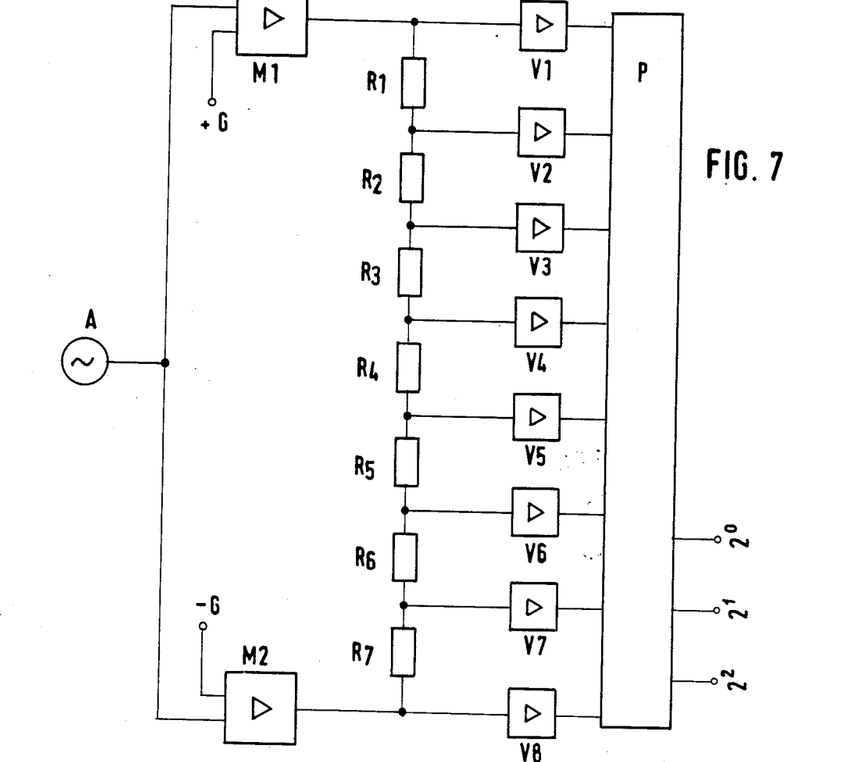
FIG. 7 a fourth embodiment of an inventive A/D converter
Figure 9:
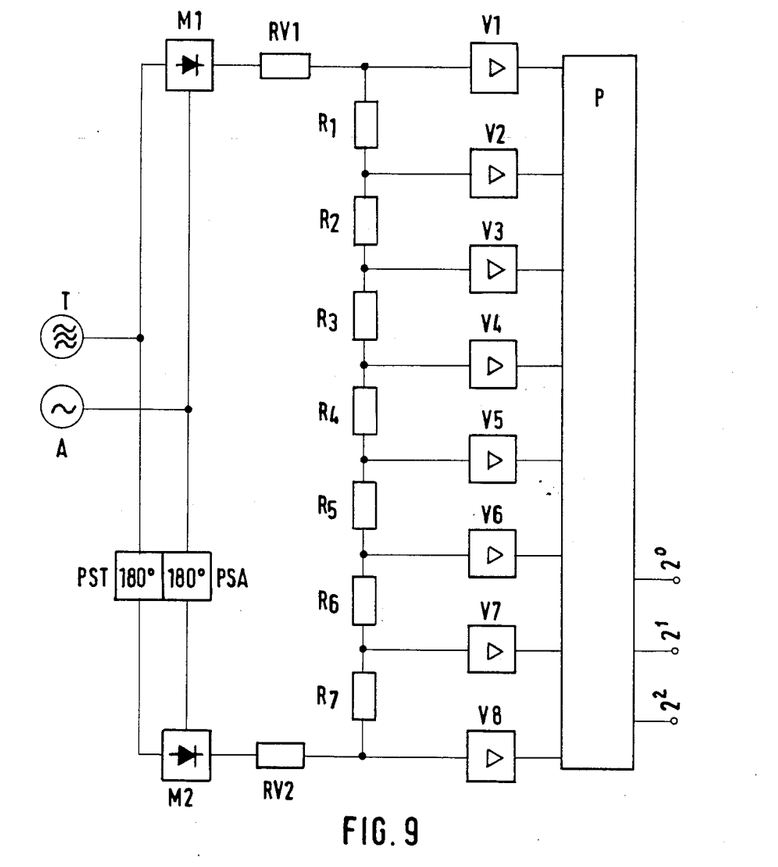
FIG. 9 a fifth embodiment of an inventive A/D converter

FIGS. 7 and 9 show a fourth and fifth embodiment of the inventive A/D converter, respectively. While the A/D converter in FIG. 9 is fed a carrier frequency signal with a frequency other than zero, FIG. 7 shows the special case of an A/D converter in which the carrier has the frequency zero, i.e. in which d.c. voltages are amplitude-modulated.

The special case shown in FIG. 7 involving the amplitude modulation of d.c. voltage carriers shall be considered first.

This A/D converter comprises two d.c. voltage modulators M1 and M2 which are each fed the analog signal A to be converted and are supplied with d.c. voltages +G and −G, respectively, having the same value but different polarity. Between the outputs of the two modulators M1 and M2 there is a chain of resistors having resistors R1 to R7. Amplifiers V1 to V8 are connected to the individual voltage divider points of this chain of resistors R1 to R7, the outputs of these amplifiers being connected to the inputs of a priority decoder P.

Each of the amplifiers V1 to V8 has the function of a zero detector. An amplifier with an output voltage of zero is assigned a first binary value, e.g. "0", while an amplifier with an output signal other than zero is assigned the opposite binary value, e.g. "1". The amplifiers V1 to V8 may be designed so as to have threshold behavior, so that voltage levels between zero and the threshold are also assigned the first binary value "0".

Figure 8:
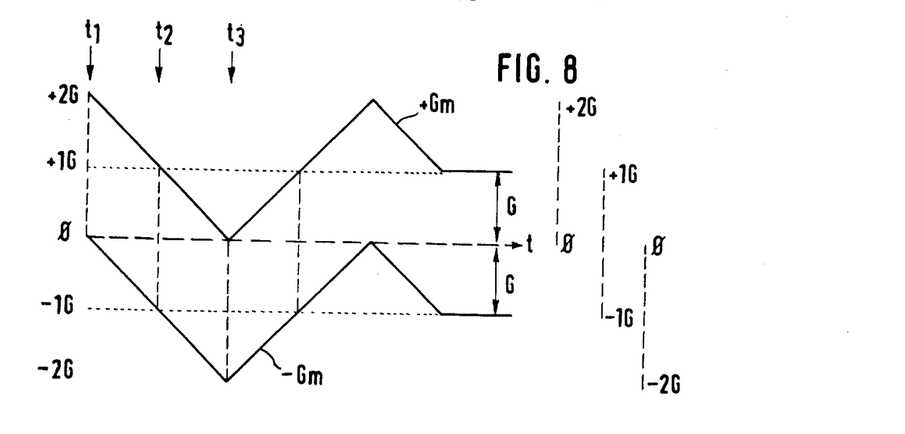
FIG. 8 a graphic view to explain the mode of operation of the A/D converter shown in FIG. 7

The mode of operation of this A/D converter will now be considered with reference to FIG. 8.

When there is no analog signal, the output of the modulator M1 gives a constant positive d.c. voltage +G to the upper end of the chain of resistors, while the modulator M2 gives a negative constant d.c. voltage −G to the lower end of the chain of resistors. There is therefore cancellation of voltage in the middle of the chain of resistors. The voltage level zero therefore occurs in the middle of the chain of resistors. Positive voltages occur at the voltage divider points located above the middle, while negative voltage levels appear at the voltage divider points located below the middle.

If analog signal A has a time pattern as shown in FIG. 8, modulator M1 gives a correspondingly modulated positive d.c. voltage +Gm to the upper end of the chain of resistors, while modulator M2 gives a modulated negative d.c. voltage −Gm to the lower end of the chain of resistors. As shown in FIG. 8, the voltage between the two ends of the chain of resistors always remains constant, i.e. 2G. However, the voltage divider point at which the voltage level zero and thus the binary value "0" occur is shifted. The voltage situation occurring at the three different points in time t1, t2 and t3 shall be considered as an example. At point in time t1, analog signal A has a voltage level +G, so that a voltage level +2G occurs at the upper end of the chain of resistors and the voltage level 0 occurs at the lower end of the chain of resistors. Thus, the voltage level 0, and thus the binary value "0", appear at the lowest amplifier V8, while the binary values "1" occur at the amplifiers V1 to V7. At the point in time t2, the analog signal is zero, so that the voltage levels +G and −G occur at the upper and lower ends of the chain of resistors, respectively. Therefore, the voltage level zero and the binary value "0" occur in the middle of the chain of resistors. At the point in time t3, the analog signal has the voltage level −G, so that the voltage levels zero and −2G appear at the upper and lower ends of the chain of resistors, respectively. Thus, the voltage level zero and the binary value "0" occur at the uppermost amplifier V1.

As a result of the fact that d.c. voltages of the same value but opposite polarity are superimposed on the analog signal in the modulators M1 and M2, the voltage cancellation point is always somewhere on the chain of resistors, as long as one makes sure that the value of d.c. voltage G is at least as great as the maximum amplitude of the analog signal. The inventive method thus allows for the voltage cancellation point to be always located in the "measuring window" formed by the chain of resistors, no matter what the value of the analog signal is.

In the embodiment shown in FIG. 9, the two modulators M1 and M2 are each fed a carrier frequency signal T and the analog signal A to be digitized, the carrier frequency signal T and the analog signal A being fed to the upper modulator M1 directly in each case, and to the lower modulator M2 after phase-shifting by 180° in each case. Damping resistors RV1 and RV2 are connected between the outputs of the modulators M1 and M2 and the ends of the chain of resistors R1 to R7, respectively. Otherwise, the embodiment shown in FIG. 9 is identical to the embodiment shown in FIG. 7.

Figure 10:
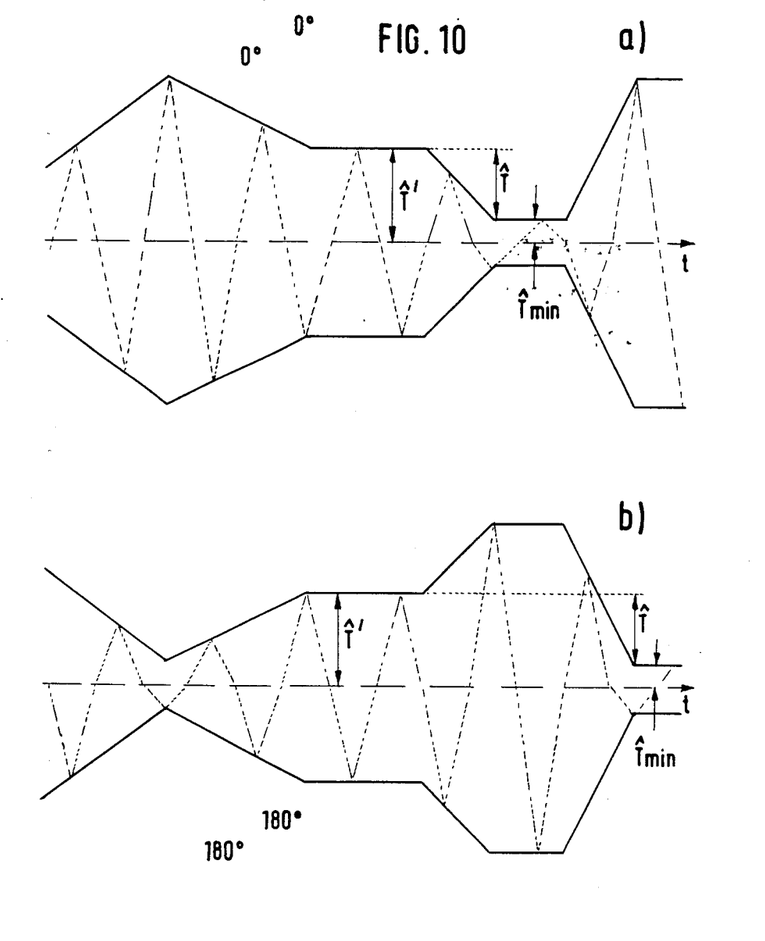
FIG. 10 a view to explain the mode of operation of the A/D converter shown in FIG. 9

The mode of operation of this A/D converter shall now be considered with reference to FIG. 10. FIGS. 10a and 10b show the amplitude-modulated carrier frequency signals generated in the modulators M1 and M2, respectively. In accordance with conventional practice, a degree of modulation is assumed which is smaller than one. This means that amplitude swing $\hat{T}$ is smaller than amplitude $\hat{T}'$ of the unmodulated carrier. The envelope curve therefore always has a minimum amplitude $\hat{T}$min.

Damping resistors RV1 and RV2 are dimensioned in such a way that they cause a voltage decrease corresponding to $\hat{T}$min.

The following auxiliary consideration may make it easier to understand the mode of operation of the A/D converter shown in FIG. 9. If the value of the d.c. voltage G applied to the modulators M1 and M2 is altered in FIG. 8, which holds for the d.c. voltage-modulating A/D converter, the two modulated d.c. voltages +Gm and −Gm move closer together or further apart. But the center line between these two modulated d.c. voltages is not altered. This means that the point in the chain of resistors at which the voltage level zero appears due to the cancellation remains unchanged. However, the voltage level which occurs in each case at the remaining points of the chain of resistors is altered.

One can now imagine that, in the case of the two amplitude-modulated carriers as shown in FIG. 10, the zero positions of the carrier frequency correspond to that case in FIG. 8 in which the value of the d.c. voltage G is zero, while maximum values of the d.c. voltage G correspond to the amplitude peaks of the carrier frequency signals. This means that the vertical distance between the two curves +Gm and −Gm varies continually in accordance with the particular instantaneous value of the carrier voltage in the view shown in FIG. 8. The center line between +Gm and −Gm which determines the cancellation point on the chain of resistors always remains the same, however.

In the case of a certain analog signal value, a voltage level zero therefore occurs at the output of one of the amplifiers V1 to V8 in FIG. 9 until this analog signal value changes. Oscillations with the carrier frequency appear at the outputs of the remaining amplifiers, the peak values of these oscillations increasing in accordance with the distance of the particular amplifier under consideration from the amplifier showing the zero voltage. The a.c. voltages occurring at the amplifiers below the amplifier showing the zero voltage have a phase position which is opposite to that of those a.c. voltages which appear at the amplifiers above the amplifier showing the zero voltage.

If flip-flops which are contained in priority decoder P or precede its inputs are now set by the positive halfwaves of these a.c. voltages, for example, a logical value pattern is obtained which shows the binary value "0", for example, in the place of the amplifier having the zero voltage and the binary value "1" at the outputs of the remaining amplifiers. The priority decoder P now detects, for example, where the binary value "0" appears for the first time, starting at the uppermost voltage divider point of the chain of resistors. The priority decoder P then provides at its outputs a dual-coded binary value pattern which depends on the place where the voltage cancellation occurs on the chain of resistors and thus on the converted analog signal value.

In the A/D converter shown in FIG. 7, anplifiers V1 to V8 must be able to process a frequency range from zero up to the maximum frequency of the analog signal. If one would like to avoid the requirement of amplifiers which can amplify down to d.c. voltage, the embodiment according to FIG. 9 is preferable, since its amplifiers V1 to V8 need only amplify the carrier frequnecy (e.g. 100 MHz), with a band width equal to twice the maximum analog signal frequency (e.g. 20 MHz).

Figure 12:
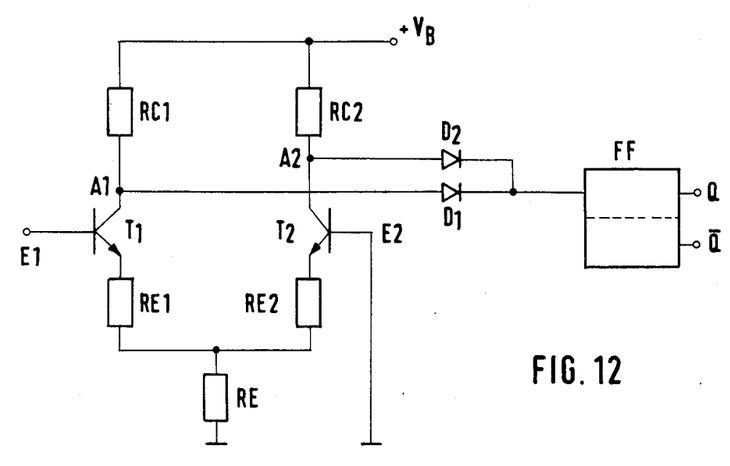
FIG. 12 a polarity inverter

FIG. 12 shows a preferred embodiment for amplifiers V1 to V8. The amplifier involved is a differential amplifier with transistors T1 and T2 whose emitters are connected via emitter resistors RE1 and RE2, respectively, to a resistor RE grounded at its other end. The collectors of the two transistors T1 and T2 are connected via collector resistors RC1 and RC2, respectively, to a voltage source $+V_B$. The collectors of T1 and T2 are connected via diodes D1 and D2, respectively, to a set input of a flip-flop FF. The base of T1 forms the input E1 of the differential amplifier connected to the chain of resistors. The base of T2 forming a second input E2 is connected to ground.

This differential amplifier acts as a polarity inverter which converts input voltages of any polarity which occur at E1 into output voltages of only one polarity. If the differential amplifier shown in FIG. 12 is used for amplifiers V1 to V8 of the A/D converter shown in FIG. 7, an output signal of the same polarity is obtained at all amplifiers at which no voltage cancellation occurs, so that this output signal can be processed using a two-level logic circuitry.

Figure 11:
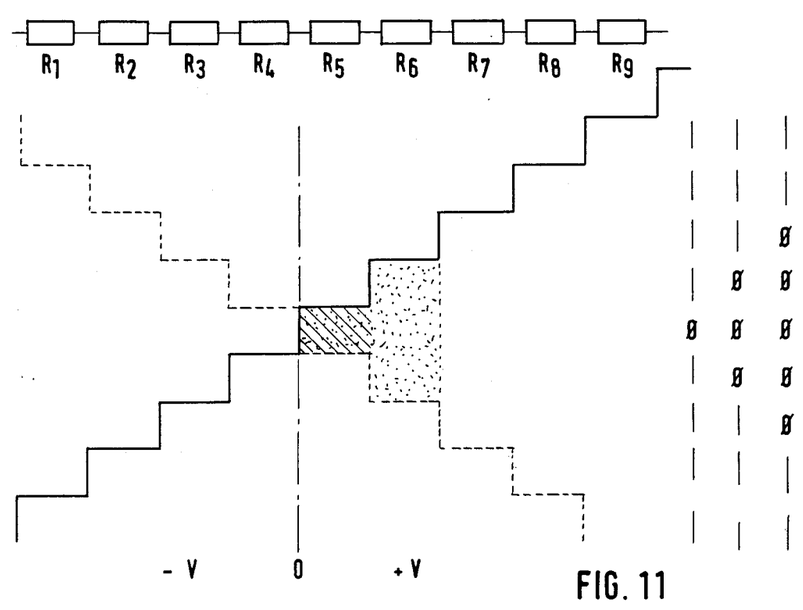
FIG. 11 a view to explain the mode of operation of a modified form of the A/D converter shown in FIGS. 7 and 9

The effect of this measure can be made clear with reference to FIG. 11. Here, the case of a chain of resistors with nine resistors R1 to R9 considered is and it is assumed that the voltage cancellation and thus the zero voltage level occur between resistors R4 and R5. If it is assumed that positive divider voltages occur to the right of the dot-dash line representing the voltage zero, and negative divider voltages occur to the left of this dot-dash line, positive voltages result at resistors R5 to R9, for the stage voltage pattern by the line, and negative voltages result at resisitor R1 to R4. Using the polarity inverter shown in FIG. 12, the staircase portion in the negative voltage range is turned into the positive voltage range, in accordance with the stage voltage shown by broken lines to the right of the dot-dash zero line. This inverted voltage pattern can be processed using a two-level logic.

FIG. 11 shows three binary value patterns at the right beside the staircase voltages. They hold for different heights of the voltage threshold used for discriminating between the logical values "0" and "1". This means that if the voltage threshold above which the logical value "1" is assigned is set very low, a binary value pattern is obtained which contains only one "0" between binary values "1". As this threshold of discrimination is raised increasingly, the number of binary values "0" between the binary values "1" becomes increasingly larger. The middle "0", however, always remains at the same place for the analog signal value assumed in FIG. 11. And this place characterizes the analog signal value.

The differential amplifier shown in FIG. 12 can also be used for the amplitude modulators M1 and M2. In the case of the A/D converter shown in FIG. 7, the input E1, for example, is fed the analog signal to be digitized and the input E2 is fed the d.c. voltage $+G$ or $-G$. In the case of the A/D converter shown in FIG. 9, one of the two inputs E1 and E2 can be fed the analog signal and the other input can be fed the carrier frequency signal. However, a diode modulator will be preferable in the case of high carrier frequencies in particular.

Figure 13:
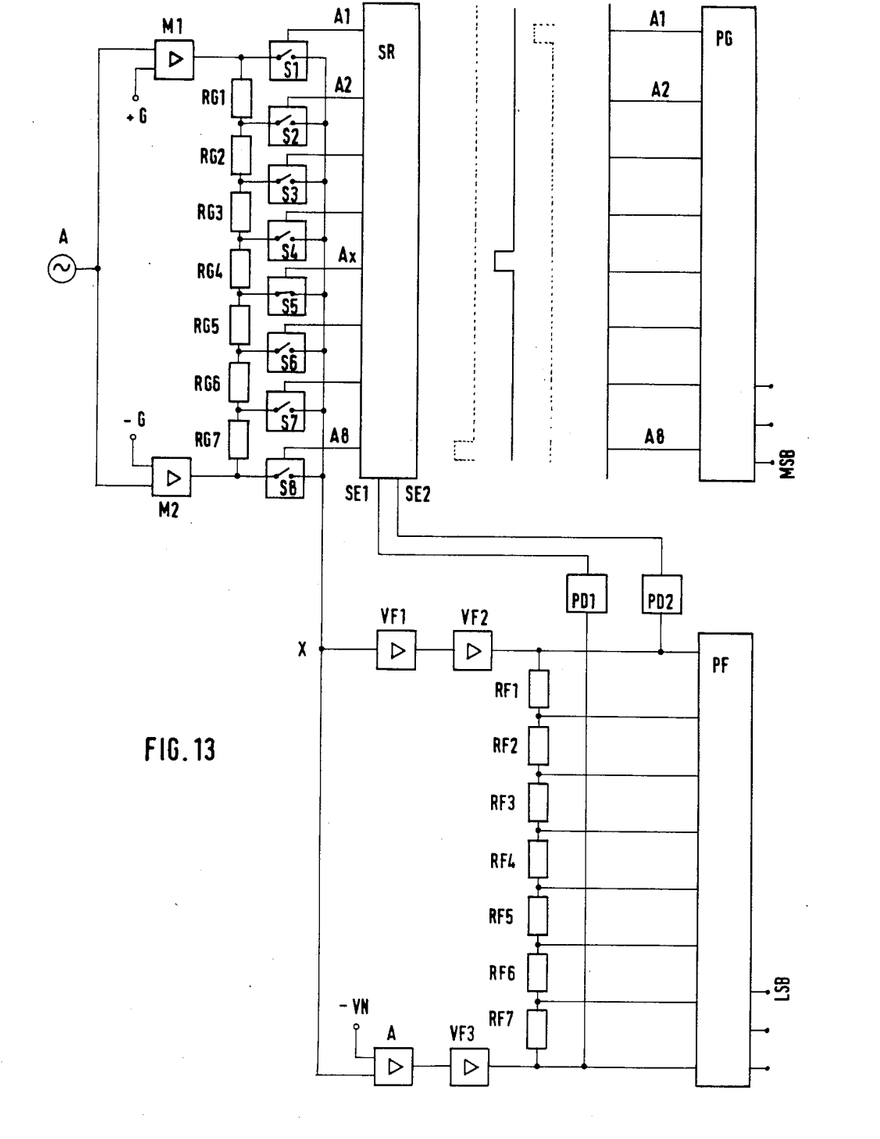
FIG. 13 a sixth embodiment of an inventive A/D converter

In the case of the A/D converters shown in FIGS. 7 and 9, high digitization resolution can be realized by a chain of resistors having an accordingly large number of resistors. An embodiment in which high digitization resolution can be obtained with relatively few resistors is shown in FIG. 13. A coarse converter portion with amplitude modulators M1 and M2 and with a coarse divider chain RG1 to RG7 is identical with the A/D converter shown in FIG. 7, with the exeception that not amplifiers, but switch S1 to S8 are connected to the individual voltage divider points. These switches S1 to S8 are connected together at their other ends in a connecting point X. Switches S1 to S8 have control terminals A1 to A8 each of which is connected to an output of a shift register SR and an input of a priority decoder PG.

In addition, a fine divider chain RF1 to RF7 is provided, connected to the connecting point X at one end via two series-connected amplifiers VF1 and VF2 and at the other end via a series circuit consisting of an adder A and an amplifier VF3. In adder A a negative d.c. voltage $-VN$ whose value is equal to the nth part of the voltage across the coarse divider chain RG1 to RG7, i.e. $2 \cdot G/n$, is superimposed on the voltage appearing at connecting point X. n refers to the number of resistors of the coarse divider chain which all have the same resistance value.

The voltage divider points of the fine divider chain RF1 to RF7 are connected to the inputs of a fine priority decoder PF. The two ends of the fine divider chain are also connected to two control inputs SE1 and SE2 of the shift register SR, respectively, via polarity detectors PD1 and PD2, respectively. Polarity detectors PD1 and PD2 detect whether the voltage levels occurring at the ends of the fine divider chain have the same or different polarity. As long as voltage levels of the same polarity occur at the two ends of the fine divider chain, the shift of a switch closing signal the shift register SR is continued. Switches S1 to S8 are then switched successively into the conductive state one by one, starting with S1, for example. As soon as polarity detectors PD1 and PD2 detect that the voltage levels at the two ends of the fine divider chain have different polarity, the shift of the switch closing signal is stopped in the shift register SR, so that the switch which is conductive at the moment, switch S5 in the example shown in FIG. 13, remains closed, while all other switches are open.

In the following explanation of the mode of operation of the A/D converter shown in FIG. 13, it is assumed that in the case of the analog signal value existing at the moment, voltage cancellation occurs in the middle of resistor RG5. The upper end of RG5 and all voltage divider points located thereabove then have positive voltage levels, and the lower end of RG5 and the voltage divider points located therebelow have negative voltage levels. It is further assumed that in the case of the value of d.c. voltages +G and −G applied to the modulators M1 and M2, a voltage of 0.1 V drops across each of resistors RG1 to RG2. A voltage value to voltage drop is negatively superimposed adder in auoer A on the voltage level occurring at connecting point X. If it is assumed that switch S1 is closed at the moment, this means that, of the voltage occurring at connecting point X, which is picked up via the closed switch S1 from the upper end of RG1, a voltage of 0.1 V is subtracted using adder A. The voltage applied at the lower end of the fine divider chain is thus lower by the voltage drop at RG1 than the voltage occurring at the upper end of RG1. Using adder A, that voltage is thus always simulated across the fine divider chain which occurs across the ends of that resistor of the coarse divider chain whose corresponding switch is closed at the moment.

An alternative possibility consists in connecting the switches S1 to S8 on the output side only to the upper end point of the fine divider chain and assigning a further switch to each resistor of the coarse divider chain at its lower end, connecting these further switches jointly to the lower end of the fine divider chain. In this case the adder A may be omitted, however, twice as many switches are required.

Since a positive voltage level appears at both ends of the resistor RG1 in the case of the analog signal value considered, the voltage level at the lower end of RG1 being larger than the negative superimposed voltage VN fed to adder A (−0.1 V in the example), the two polarity detectors PD1 and PD2 detect the same polarity of the voltage levels at the two ends of the fine divider chain. Therefore, the switch closing signal is shifted in the shift register SR from the output A1 to the output A2, whereupon the switch S2 is switched into the conductive state and the switch S1 is opened again. This shift of the switch closing signal continues until the switch S5 is switched into the conductive state. Since the voltage cancellation occurs in the middle of resistor RG5 according to the assumption made for this example, the voltage occurring at its upper end is positive, although by a value which is smaller than the voltage drop of 0.1 V across this resistor RG5. After superimposing of the negative voltage level −0.1 V in the adder, a negative voltage level therefore occurs at the lower end of the fine divider chain. The two polarity detectors PD1 and PD2 thus detect different polarity at the two ends of the fine divider chain, which leads to the shift of the switch closing signal being terminated in the shift register SR. Switch S5 thus remains switched in the conductive state, while all other switches are open. The voltage curve occurring across the resistor RG5, which has the value zero somewhere along this resistor and changes its polarity there, is now delivered to the fine divider chain, so to speak.

In order to obtain higher sensitivity on the part of the fine divider chain, the voltage level delivered by switch S5 is amplified in the amplifier VF2, for example by the factor of ten. The voltage signal occurring at the output of the adder A is amplified in the amplifier VF3 by the same factor. If the adder A is designed as an amplifying adder, an amplifier VF1 is series-connected to the amplifier VF2, amplifier VF1 having the same amplification as the adder A.

The voltage curve given to the fine divider chain via the switch S5 is examined as to the position of the voltage zero point using the fine priority decoder PF. At the output of this fine priority decoder PF a binary value pattern is then available in a dual-coded fashion, characterizing the place of the voltage zero point on the fine divider chain.

The output Ax of the shift register SR, at which the switch closing signal stops when different polarities are detected in the voltages applied to the two ends of the fine divider chain, characterizes that resistor on the coarse divider chain at which the voltage cancellation and thus the voltage level zero occur. The position of this output Ax provides a rough characterization of the analog signal value to be digitized. A bit pattern corresponding to this rough analog signal value is provided in a dual-coded fashion by the coarse priority decoder PG.

At the end of this analog-digital conversion, the more significant bits (MSB) of the digitized analog signal value are available at the output of the coarse priority deocoder PG and the less significant bits (LSB) are available at the output of the fine priority decoder PF.

We claim:

1. A method for analog/digital conversion, comprising the steps of:
   amplitude modulating a first d.c. voltage signal with an analog signal to be digitized;
   amplitude modulating a second d.c. voltage signal with the analog signal to be digitized, said first and second voltage signals having the same voltage value but opposite polarity;
   feeding said amplitude modulated first d.c. voltage signal into a first end of a chain of resistors and the amplitude modulated second d.c. voltage signal into a second end of the chain of resistors;
   detecting a voltage divider point in the chain of resistors at which cancellation of the amplitude modulated d.c. voltage signals fed into the first and second ends of the chain of resistors occurs; and
   assigning the voltage divider point a first binary value and all other resistor voltages a second binary value to produce a binary value pattern characterizing the converted analog signal value.

2. An analog/digital converter, comprising:
   means for receiving an analog signal to be digitized;
   means for generating a first d.c. voltage signal that is to be modulated;
   a first d.c. voltage modulator which is fed the analog signal as an amplitude modulating signal and the first d.c. voltage signal;
   means for generating a second d.c. voltage signal that is to be modulated, said second voltage signal having the same amplitude but opposite polarity from said first voltage signal;
   a second d.c. voltage modulator which is fed the analog signal as an amplitude modulating signal and the second d.c. voltage signal;
   a chain of resistors connected between the outputs of the first and second d.c. voltage modulators; and
   a plurality of zero detectors connected to individual voltage divider points of the chain of resistors, each zero detector generating a binary output signal that has a first binary value when zero is detected and a second binary value when non-zero is detected, said binary value pattern of the output signals of the zero detectors characterizing the digitized analog signal value.

3. The analog/divider converter according to claim 2, wherein the chain of resistors is formed by a coarse divider chain consisting of n-resistors with the same resistance values;

a controllable switch is connected to each individual voltage divider point of the coarse divider chain, the sides of these switches not connected to the voltage divider points bieng connected together in a common connecting point;

the voltage occurring at the common connecting point is applied to one end of a second chain of resistors forming a fine divider chain, the other end thereof being fed this voltage after superimposing of a d.c. voltage equal to the nth part of the voltage applied across the coarse divider chain, and zero detectors also being connected to the voltage divider points thereof;

the control inputs of the individual switches being connected to a switching control logic which compares the polarities of the voltages occurring at the two ends of the fine divider chain and switches the switches successively into the conductive state one by one, in order to select that switch at whose switching into the conductive state voltages of different polarity occur at the ends of the fine divider chain;

and the digitized analog signal is derived from the switch state pattern and the pattern of the output signals of the zero detectors of the fine divider chain.

4. The analog/digital converter according to claim 2, wherein the control inputs of the switches are connected to the outputs of a shift register and are subjected successively in fixed cycles to a switch closing signal from the shift-register until the occurrence of voltages of the same polarity at the ends of the fine divider chain is reported to the shift register.

5. The analog/digital converter according to claim 2, wherein the two d.c. voltage modulators are each formed by a differential amplifier one input of which is fed the analog signal and the other input of which is fed the d.c. voltage to be modulated.

6. The analog/digital converter according to claim 2, wherein polarity inverters are connected to the individual voltage divider points for converting the input voltages of any polarity into output voltages of only one polarity.

7. The analog/digital converter according to claim 2, wherein the voltage divider points are each connected to the input of a priority decoder, each chain being followed by its own priority detector when a coarse divider chain and a fine divider chain are used.

8. The analog/digital converter according to claim 2, wherein the resistors of the divider chain are selected from the group consisting of ohmic resistors, inductivities and/or capacities.

* * * * *